May 31, 1966 G. C. SZIKLAI ET AL 3,254,234

SEMICONDUCTOR DEVICES PROVIDING TUNNEL DIODE FUNCTIONS

Filed April 12, 1963

WITNESSES

Edwin E. Bassler

James F. Young

INVENTORS
George C. Sziklai &
John W. Dzimianski
BY Gordon H. Telfer
ATTORNEY 3,254,234

SEMICONDUCTOR DEVICES PROVIDING TUNNEL DIODE FUNCTIONS

George C. Sziklai, Carnegie, Pa., and John W. Dzimianski, Catonsville, Md., assignors to Westinghouse Electric Corporation, Pittsburgh, Pa., a corporation of Pennsylvania Filed Apr. 12, 1963, Ser. No. 272,680
3 Claims. (Cl. 307—88.5)

This invention relates generally to semiconductor devices which provide the functions of a tunnel diode and, more particularly, to semiconductor devices which permit control of tunnel diode characteristics by features incorporated within the same body of semiconductive material as that which provides the tunnel diode functions.

Tunnel diodes, which are now well known, have a voltage-current characteristic differing from that of conventional diodes in that when the junction is biased in the forward direction there is a lower resistance near the origin. With increasingly larger forward bias the characteristic reverses, that is, less current is passed even though the voltage is greater to produce the well known "valley" in the characteristic curve. At still higher forward voltages the characteristic approaches that of a conventional diode. In general, the characteristic curve for a particular tunnel diode is fixed by the semi-conductive material used and the thickness and impurity concentration of the junction. While numerous tunnel diode applications have been described in the literature it is desirable to make the device more generally useful by permitting some effective control of the characteristic. In particular, it is desirable to vary the series resistance of the tunnel diode to achieve, as desired, either monostable operation wherein the load line intersects only one portion of the curve or bistable operation in which the load line intersects the characteristic curve at two stable operating points.

It is therefore an object of the present invention to provide an improved semiconductor device performing tunnel diode functions.

Another object is to provide a tunnel diode type device which may be selectively operated in a bistable mode or in a monostable mode.

Another object is to provide a semiconductor device useful as a binary logic element.

The present invention, briefly, comprises a semiconductor device including a tunnel diode junction and a voltage controlled resistance in series with the tunnel diode junction within the same body of semiconductive material. Variation of the voltage controlled resistance produces a shift in the load line for the device and permits either bistable or monostable operation.

The present invention, together with the above mentioned and further objects and advantages thereof, may best be understood by reference to the following description, taken in connection with the accompanying drawings, in which.

Figure 1:
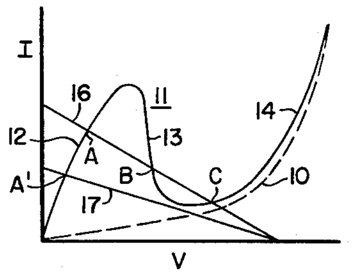
FIGURE 1 is a curve of the forward characteristic for a typical device in accordance with the present invention.

Referring now to FIG. 1, there is shown a curve of current on the vertical axis and voltage on the horizontal axis. The dotted line 10 is an example of the forward characteristic of a conventional p-n junction diode and, as is well known, the current and voltage are each single valued. The solid curve 11 is an example of the current-voltage characteristic of a tunnel diode. The tunnel diode characteristic includes a first region 12 near the origin which is of low resistance relative to that of the conventional diode, that is, current increases relatively rapidly with small increases in voltage. The current increases to a maximum or peak value and then decreases with an additional increase in voltage to form a second region 13 of the characteristic of negative impedance. In a third region 14 of the curve, the characteristic approaches that of the conventional junction diode. Thus, as is well known, for some current values the voltage has more than one possible value.

A first load line 16 is shown for the device when the tunnel diode junction is in series with a relatively low resistance. It will be noted that this load line 16 intersects the tunnel diode characteristic at three points A, B and C. The operating point A in the first region 12 of the curve is a stable point and the operating point C in the third region 14 of the curve is a stable point so that bistable operation of the device between these two stable operating points is possible, that is, the device will be driven to one of these operating points depending upon the magnitude of the voltage across the junction. A second load line 17 is shown which represents the case in which the tunnel diode junction is in series with a relatively higher resistance. This load line 17 intersects the characteristic curve at only one operating point A' which is in the first region 12 of the curve. This, therefore, is a case of monostable operation.

In some applications of tunnel diodes, it is desirable to selectively operate the device between two stable states or in a single stable state. In bistable operation, the device is relatively sensitive to variations in applied signal while in the monostable case the device is relatively insenstive. If by some manner the load line could be shifted between 16 and 17, the device may be used as a switch. Such possible applications occur in binary logic circuits and numerous other possible applications will suggest themselves to those skilled in the art.

It is of course possible to employ a tunnel diode in a series circuit arrangement with a separate variable resistance to achieve the type of operation above described. However, for reasons of reduced cost and greater reliability and savings of weight and space it is greatly preferred to provide the variable resistance within the same unitary body of semiconductive material with the tunnel diode junction.

Figure 2:
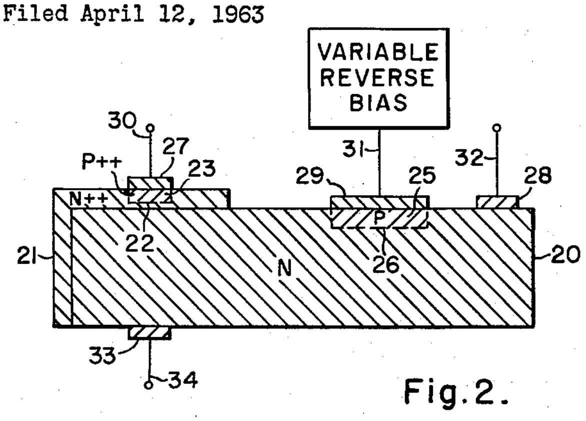
FIG. 2 is a cross-sectional view of one embodiment of the present invention.

Referring now to FIG. 2, an example of this invention is shown including an n-type substrate 20 and a more highly doped n++ area 21 on a portion of the substrate surface which together with the substrate provides a first region of a first type of semiconductivity. On the n++ portion 21 of the first region, a p++ region 23 is formed to form a second region of a second type of semiconductivity forming a tunnel diode junction 22 with the n++ portion 21 of the first region. Separate from the second semiconductive region 23 there is a third semiconductive region 25 of p-type semiconductivity forming a p-n junction 26 with the substrate 20. On the surface of the substrate and positioned on the far side of the p-n junction 26 relatively to the tunnel diode junction 22 is an ohmic contact 28. Also, in close proximity to the tunnel diode junction 22, is a second ohmic contact 33.

In the device shown in FIG. 2 the tunnel diode junction 22 and the p-n junction 26 are formed by alloying techniques and leads 30 and 31 may be connected to the metal 27 and 29 fused to the semiconductive surface. Leads 32 and 34 are also connected to the ohmic contacts 28 and 33. The lead 30 to the p++ region 23 and the lead 32 to the ohmic contact 28 serve as the ground and power supply terminals of the device, respectively;

the third lead 31 serves for the application of a variable reverse bias to control the variable resistance which it is desirable to produce within the device, and lead 34 to the ohmic contact 33 serves as a signal lead.

The p-n junction 26 formed by the third semiconductive region 25 with the substrate 20 acts in the manner of a gate junction in a unipolar transistor. Upon application of a reverse bias across the junction a depletion layer is created which restricts the effective current carrying path past the junction and hence effectively increases the load resistance of the device. In this way the operation described in connection with FIG. 1 can be achieved.

Figure 3:
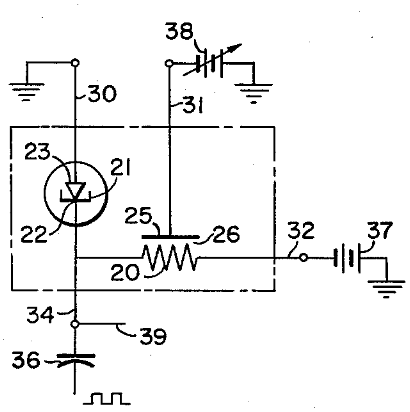
FIG. 3 is a circuit schematically illustrating the functioning of a device in accordance with this invention.

In FIG. 3 is shown, within the dotted line, the approximate equivalent circuit of the device of FIG. 2 and the reference numerals are the same as those used for the corresponding elements of that device. One manner of applying devices in accordance with this invention is shown in FIG. 3 where the lead 30 on one side of the tunnel diode junction 22 is grounded and a square wave signal is applied to lead 34 on the other side of the tunnel diode junction 22 through an external coupling capacitor 36. Carriers injected by the tunnel diode junction into the bulk material 20 are drawn to lead 32 by the power supply 37 connected thereto. In passing through the bulk material 20 the carriers are brought under the influence of the depletion layer created at the junction 26 by application of a variable reverse bias from source 38 to lead 31. The lead 39 is to indicate that signal may be applied to other stages as well. With a relatively high reverse bias applied by the source 38 the situation represented by load line 17 in FIG. 1 will exist, and a low voltage will appear across the ground and signal leads 30 and 34. With a relatively low reverse bias applied, load line 16 of FIG. 1 represents the situation and the voltage across leads 30 and 34 will switch between that at point A and point C depending on the signal magnitude. Thus the elementary circuit shown in FIG. 3 is suitable as a clearable storage or memory element or as a counter in accordance with known digital computer techniques.

The device of FIG. 2 may be fabricated, for example, by starting with an n-type semiconductive member of a material such as germanium doped with arsenic to a bulk resistivity of about 1 to 3 ohm cm. The semiconductive member may be, for example, a wafer or die cut from a grown crystal or it may be a portion of a semiconductive dendrite produced in accordance with the teachings of Patent 3,031,403, issued April 24, 1962, by A. I. Bennet, Jr., and assigned to the assignee of the present invention. The semiconductive body is diffused to form an n++ skin over the surface. This may be achieved by diffusing with an n-type impurity such as arsenic to a surface concentration of about $10^{20}$ atoms per cubic centimeter. The n++ layer is removed from the right hand portion of the device by, for example, conventional masking and etching techniques. The structure at this stage of fabrication thus consists of the substrate 20 and the n++ region 21 shown in FIG. 2.

Subsequently, four alloy foil members are placed on the surface of the device. A first alloy foil member which may be of indium including a small percentage of a p-type impurity such as gallium is disposed on the n++ layer 21. A second alloy foil member also containing indium with a small percentage gallium is placed on the original n-type substrate 20 and third and fourth alloy foil members which may comprise tin including a small percentage of an n-type impurity such as antimony are disposed in position for the ohmic contacts 28 and 33. The alloy foil members are fused to the semiconductive body by heating in a reducing, inert, or vacuum atmosphere to a temperature of about 500° C. as a result of which the p++ region 23 is formed by the first foil member, the p-type region 25 is formed by the second alloy foil member and ohmic contacts 28 and 33 are formed by the third and fourth alloy foil members.

Alternative methods for the fabrication of devices in accordance with this invention will be apparent to those skilled in the art. The manner in which the tunnel diode junction 22 is fabricated may be in accordance with any of the known methods of tunnel diode junction fabrications. The manner in which the p-n junction 26 is formed may be in accordance with any of the known techniques of unipolar transistor fabrication. It may be desirable in some instances to restrict the substrate thickness under the p-n junction, such as by etching, to reduce the maximum channel dimension which is controlled by the depletion layer formed at the junction. It may be desirable, also, to form a second p-n junction on the under surface of the device for additional control of the variable resistance.

The tunnel diode junction 22 is formed with a junction thickness of about 200 Angstroms or less to permit tunneling and the material in which it is formed is degenerate, that is, the doping concentration is sufficiently high that the Fermi level is located inside either the conduction or valence band of the material. In general, the impurity concentrations for the achievement of this condition are of the order of $10^{19}$ to $10^{22}$ atoms per cubic centimeter.

In the example shown in FIG. 2 as well as in subsequent examples of the invention a certain type of semiconductivity is given to each of the regions. However, it is to be understood that the semiconductivity type of the various regions may be reversed from that shown. For example, in FIG. 2 a p-type substrate with a p++ surface layer may be employed with the second and third semiconductive regions being n++ type and n-type respectively.

While the invention has been described as being incorporated with a monocrystalline body of germanium, it is to be understood that other semiconductive materials such as silicon, gallium arsenide and other known materials may be employed with suitable known impurities to form the various regions of the device.

Figure 5:
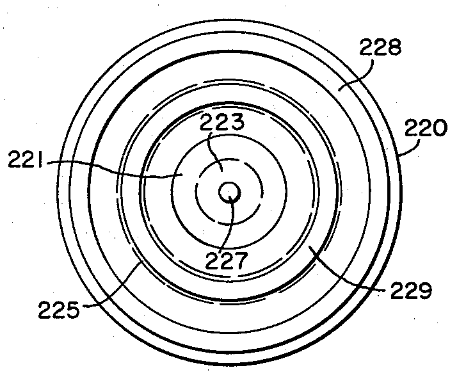
FIGS. 4 and 5 are, respectively, a cross-sectional view and a plan view of an alternative embodiment of the invention.
Figure 4:
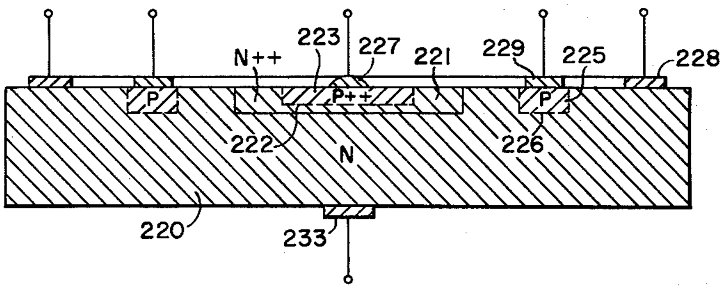

Referring to FIGS. 4 and 5, a device is shown in which the regions are symmetrically arranged and in which the semiconductive regions are formed by diffusion techniques on the substrate. An n++ region 221 is diffused into the starting material 220 in the center of the upper surface and a concentric p++ region 223 is diffused therein to form the tunnel diode junction 222. A p-type region 225 is diffused in an annular pattern surrounding the tunnel diode junction 222 to provide the p-n junction 226 for the variable resistance control. A dot ohmic contact 227 is made to the p++ region 223 on one side of the tunnel diode junction, an annular ohmic contact 229 is made to the p-type region, an annular ohmic contact 228 is made to the substrate material surrounding the p-type region and an ohmic contact 233 on substrate 220 under n++ region 221 so that the device operates in the manner of the device of FIG. 2.

The geometrical configurations described in the examples shown are merely representative of those which may be employed. It should be noted that devices in accordance with this invention may be incorporated in more extensive monolithic semiconductor devices which provide more functions and are known in the art as functional electronic blocks or integrated circuits.

While the present invention has been shown and described in a few embodiments only, it is to be understood that numerous modifications may be made without departing from the spirit and scope thereof.

What is claimed is:

1. Electronic apparatus operable as a controllable tunnel diode comprising: a unitary body of semiconductive material including a substrate of a first type of semiconductivity, a first semiconductive region on said substrate of said first type of semiconductivity and containing sufficient impurities to be degenerate; a second semiconductive region of a second type of semiconductivity having sufficient impurities to be degenerate and forming a p-n tunnel diode junction with said first semiconductive region, said tunnel diode junction exhibiting a current-voltage characteristic curve having two stable states with a region of negative impedance therebetween; a third semiconductive region of said second type of semiconductivity forming a p-n junction with said substrate; and power supply connection means disposed on said substrate at a position remote from said tunnel diode junction relative to said p-n junction; means to apply a forward bias across said tunnel diode junction by the application of potential to said second semiconductive region and to said power supply connection means to establish a current flow path from said tunnel diode junction to said power supply connection means; means to apply a variable reverse bias across said p-n junction to form a depletion layer in said substrate and to vary the resistance of said current flow path between a first value producing a first load line that intersects the tunnel diode characteristic curve in both of said two stable states and a second value producing a second load line that intersects the tunnel diode characteristic curve in only one of said two stable states; and signal connection means made to said substrate in close proximity to said tunnel diode junction; means selectively to apply a signal to said signal connection means to cause switching between said two stable states only if said resistance of said current flow path is at said first value.

2. A semiconductor device in accordance with claim 1 wherein said power supply connection means and said signal connection means each includes an ohmic contact disposed on said substrate; said tunnel diode junction has a thickness of less than about 200 angstroms and the impurity doping concentration of a material in which said tunnel diode junction is formed is of the order of from $10^{19}$ atoms per cubic centimeter to about $10^{22}$ atoms per cubic centimeter.

3. A semiconductor device in accordance with claim 1 wherein said substrate and said first semiconductive region are of n-type semiconductivity and said second and third semiconductive regions are of p-type semiconductivity.

References Cited by the Examiner

UNITED STATES PATENTS

| | | | |
|---|---|---|---|
| 2,904,704 | 9/1959 | Marinace | 317—234 |
| 3,010,033 | 11/1961 | Noyce | 317—234 |
| 3,018,423 | 1/1962 | Aarons et al. | 317—234 |
| 3,019,352 | 1/1962 | Wertwijn | 317—235 |
| 3,033,714 | 5/1962 | Ezaki et al. | 317—234 |
| 3,054,912 | 9/1962 | Strull et al. | 317—234 |
| 3,074,003 | 1/1963 | Luscher | 317—235 |
| 3,079,512 | 2/1963 | Rutz | 317—235 |
| 3,097,336 | 7/1963 | Sziklai et al. | 317—235 |
| 3,171,042 | 2/1965 | Matare | 307—88.5 |

JOHN W. HUCKERT, *Primary Examiner.*

JAMES D. KALLAM, *Examiner.*

A. M. LESNIAK, *Assistant Examiner.*